United States Patent
Kwon et al.

[11] Patent Number: 5,808,935
[45] Date of Patent: Sep. 15, 1998

[54] COMMON SOURCE LINE DRIVING CIRCUIT FOR USE IN NONVOLATILE SEMICONDUCTOR MEMORIES

[75] Inventors: Seok-Chun Kwon; Jin-Ki Kim, both of Seoul, Rep. of Korea

[73] Assignee: Samsung Electronics Co., Ltd., Kyungki-do, Rep. of Korea

[21] Appl. No.: 585,311

[22] Filed: Jan. 11, 1996

[30] Foreign Application Priority Data

Jan. 7, 1995 [KR] Rep. of Korea ..................... 1995-230

[51] Int. Cl.$^6$ .................................... G11C 11/34
[52] U.S. Cl. ................... 365/185.17; 365/185.22
[58] Field of Search ............ 365/185.17, 185.22

[56] References Cited

U.S. PATENT DOCUMENTS

| | | | |
|---|---|---|---|
| 4,279,024 | 7/1981 | Schrenk | 365/185.22 |
| 4,794,564 | 12/1988 | Watanabe | 365/185.22 |
| 4,888,738 | 12/1989 | Wong et al. | 365/185.22 |
| 4,939,690 | 7/1990 | Momodomi et al. | 365/185.17 |
| 5,124,945 | 6/1992 | Schreck | 365/185.22 |
| 5,214,606 | 5/1993 | Hashimoto | 365/185.22 |
| 5,253,206 | 10/1993 | Tanaka et al. | 365/185.17 |
| 5,297,095 | 3/1994 | Sato et al. | 365/185.22 |
| 5,297,096 | 3/1994 | Terada et al. | 365/185.22 |
| 5,313,432 | 5/1994 | Lin et al. | 365/185.22 |
| 5,327,384 | 7/1994 | Ninomiya | 365/185.22 |
| 5,337,281 | 8/1994 | Kobayashi et al. | 365/185.22 |
| 5,398,204 | 3/1995 | Maruyama | 365/185.22 |
| 5,400,287 | 3/1995 | Fuchigami | 365/185.22 |
| 5,408,433 | 4/1995 | Hashimoto | 365/185.22 |
| 5,537,357 | 7/1996 | Merchant et al. | 365/185.22 |
| 5,557,572 | 9/1996 | Sawada et al. | 365/185.22 |
| 5,590,074 | 12/1996 | Akaogi et al. | 365/185.22 |
| 5,615,154 | 3/1997 | Yamada | 365/185.22 |

*Primary Examiner*—A. Zarabian
*Attorney, Agent, or Firm*—Cushman Darby & Cushman IP Group of Pillsbury Madison & Sutro LLP

[57] ABSTRACT

A nonvolatile semiconductor memory having a common source line driving circuit which simply ensures a sufficient threshold voltage margin for erased memory cells during an erase verifying operation. The nonvolatile semiconductor memory includes a resistance which cause, during an erase verifying operation of the memory after erasure of the memory cells, an erase verifying potential to develop on the common source line, allowing verification that each memory cell has a predetermined threshold voltage. The erase verifying voltage is developed across the resistance in response to a predetermined current supplied from a current source circuit connected to the bit line, and flowing through the drain-source paths of memory cells which are series-connected between the bit line and the current source line.

2 Claims, 2 Drawing Sheets

COMMON SOURCE LINE DRIVING CIRCUIT FOR USE IN NONVOLATILE SEMICONDUCTOR MEMORIES

BACKGROUND OF THE INVENTION (1) Field of the Invention

The present invention relates to electrically erasable and programmable read only memories (hereinbelow, referred to as EEPROMs), and more particularly, to a common source line driving circuit for use in an EEPROM with NAND type memory cells.

(2) Description of the Related Art

A conventional EEPROM with NAND type memory cells comprises a memory cell array having a plurality of NAND cell units (or cell units) which are arranged in a matrix form of rows and columns. Each cell unit has a cell selection transistor, a plurality of memory transistors and a ground selection transistor whose drain-source paths are connected in series. Each memory transistor is a floating gate type memory cell having a source, a drain, a floating gate, and a control gate. The drains of the cell selection transistors (hereinbelow also referred to as first selection transistors) in the same row are coupled with a corresponding bit line of a plurality of bit lines. The gates of the first selection transistors in the same row are coupled with a corresponding cell selection line of a plurality of cell selection lines. The control gates of memory transistors in the same row are coupled with a corresponding word line of a plurality of word lines, and the gates of ground selection transistors (hereinbelow also referred to as second selection transistors) are coupled with a corresponding ground selection line of a plurality of ground selection lines. The sources of the second selection transistors in the same row are coupled to the common source line driving circuit via a common source line. Cell units in the same row constitute a memory block.

The conventional EEPROM is programmed after erasure of all memory transistors in the memory cell array or in one or more memory blocks. Each erased memory transistor is changed into a transistor of depletion type or mode having a negative threshold voltage. Each programmed memory transistor is changed into a transistor of enhancement type or mode having a positive threshold voltage. The erased memory transistors are verified prior to programming to determine whether or not all of them are desirably erased. After the erase verifying operation, if any one of the memory transistors was not erased, the erasing operation is repeatedly performed until all of the memory transistors (or memory cells) are erased. This technique is disclosed in U.S. application Ser. No. 08/441,477 and U.S. application Ser. No. 08/523,612, both of which are incorporated herein by reference.

FIGS. 1A to 1C illustrate a potential relationship of various parts of a NAND cell unit during an erase verifying operation of the conventional EEPROM. In FIG. 1A, a ground potential GND is applied to each of the control gates of the erased memory transistors MC. A power supply potential Vcc is applied to the gates of first and second selection transistors ST1 and ST2, and a ground potential Vss is applied to the common source line CSL from a common source line driving circuit (not shown). During the erase verifying operation, a sense amplifier SA supplies a constant current $I_v$ to a bit line BL. If memory cells MC are all erased to negative threshold voltages, transistors ST1 and ST2 having been turned on under the above mentioned conditions a complete current path is formed to the common source line CSL and the bit line BL, causing the bit line BL to go to ground, i.e. "L" level. In other words, when the erased memory cells MC each have a threshold voltage below ground, each erased memory cell functions as an on-cell, such as a conductive transistor, during the erase verifying operation. However, a problem with this prior art technique is that it is very difficult to determine whether each of the erased memory cells provides a desired threshold voltage margin, i.e., a designed threshold voltage equal to or lower than a predetermined negative value.

Referring to FIG. 1B, the control gates of the erased memory cells MC are coupled to a negative potential $-V_b$, the gates of first and second selection transistors ST1 and ST2 are coupled to a power supply potential Vcc and the common source line CSL is driven to a ground potential Vss. In this prior art, since each of the memory cells MC is erased to a threshold voltage equal to or below $-V_b$, a significant threshold voltage margin may be easily accomplished. However, since the row decoder for driving the control gates of memory cells must further comprise a separate voltage generator for independently producing the negative voltage $-V_b$, design of the row decoder is seriously complicated. Moreover, since the on-chip size of the row decoder becomes larger, this technique may not be applied to high density EEPROMs.

Referring to FIG. 1C, the control gates of memory cells MC are coupled to a ground potential, the gates of first and second selection transistors ST1 and ST2 are coupled to a power supply potential Vcc and the common source line CSL is driven to a positive potential $V_s$. In this prior art technique, each of memory cells MC are ensured to have a threshold voltage margin of at least $V_s$, but the common source line driving circuit requires a voltage generator for generating the voltage $V_s$. Therefore, there remains a need for a simple common source line driving circuit which ensures a sufficient threshold voltage margin for erased memory cells but does not require a separate voltage generator.

SUMMARY OF THE INVENTION

It is therefore an object of the present invention to provide a nonvolatile semiconductor memory comprising a common source line driving circuit which simply ensures that erased memory cells achieve a sufficient threshold voltage during an erase verifying operation.

To achieve the above object of the present invention, a common source line driving circuit for a nonvolatile semiconductor memory includes a resistance which is operably connected to a common source line during an erase verifying operation of the memory. The resistance causes, during an erase verifying operation of the memory after erasure of the memory cells, an erase verifying voltage to develop which allows verification that each erased memory cell on the common source line has a threshold voltage that exceeds a predetermined value.

According to another aspect of the present invention, the common source line circuit provides, during an erase verifying operation after erasure of a selected memory cell and a read operation for the selected memory cell, different potentials on one common source line associated with the selected memory cell in response to a predetermined current from the current source circuit through the selected memory cell.

BRIEF DESCRIPTION OF THE DRAWINGS

The invention, its features, and its advantages are describe below in conjunction with the following drawings, in which.

DETAILED DESCRIPTION OF THE PREFERRED EMBODIMENT

Figure 1:
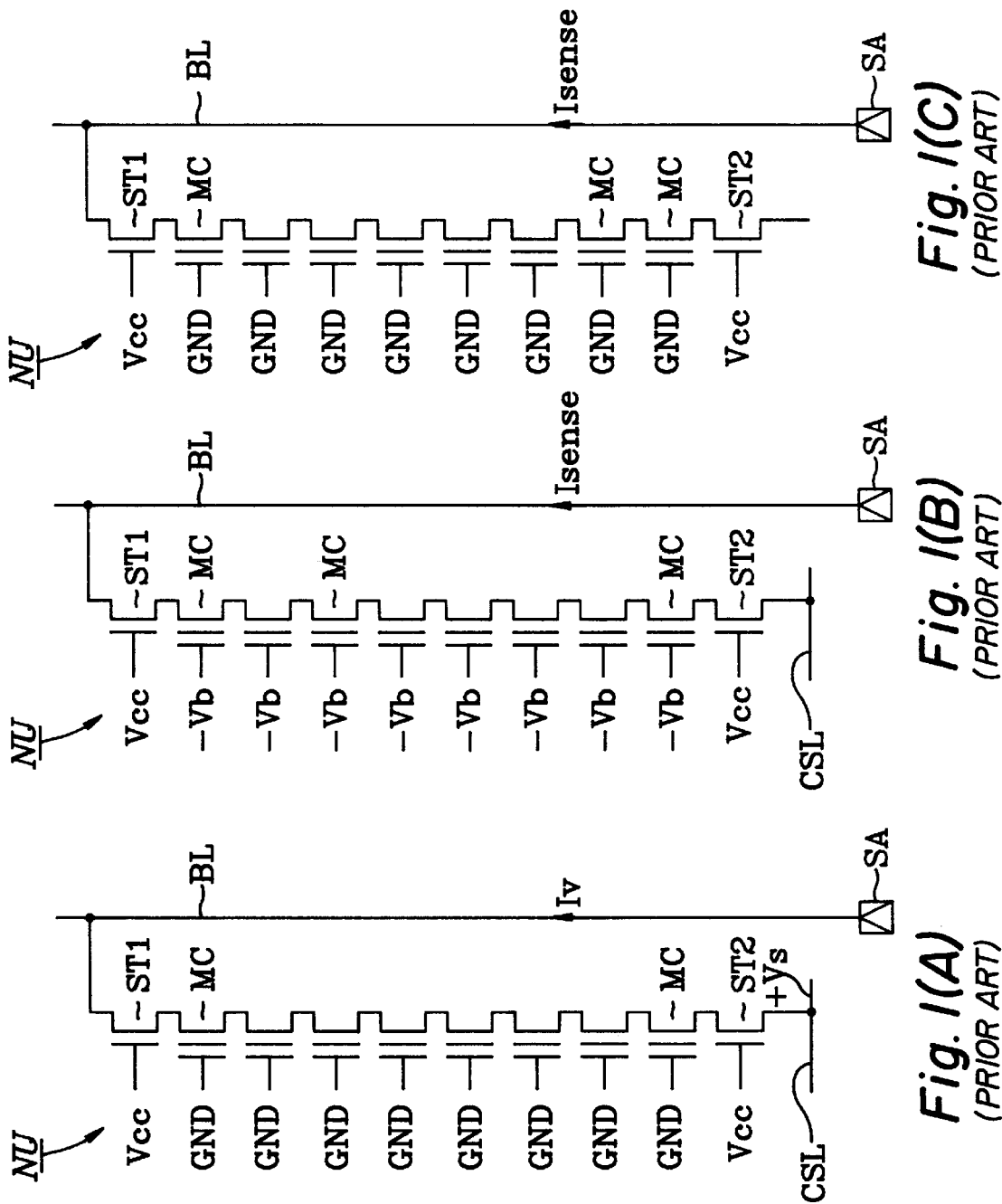
FIG. 1A to FIG. 1C are diagrams each illustrating a potential relationship of various parts of a NAND cell unit during an erase verifying operation of the prior art.

A detailed description of the preferred embodiment will be made hereinbelow with reference to the accompanying drawings. Although the present invention will be described in connection with an EEPROM having NAND type memory cells, it should be noted that the present invention can be applied to EEPROMs having other types of memory cells, such as a NOR type.

In the drawings, like reference numerals are used for like elements or parts.

Figure 2:
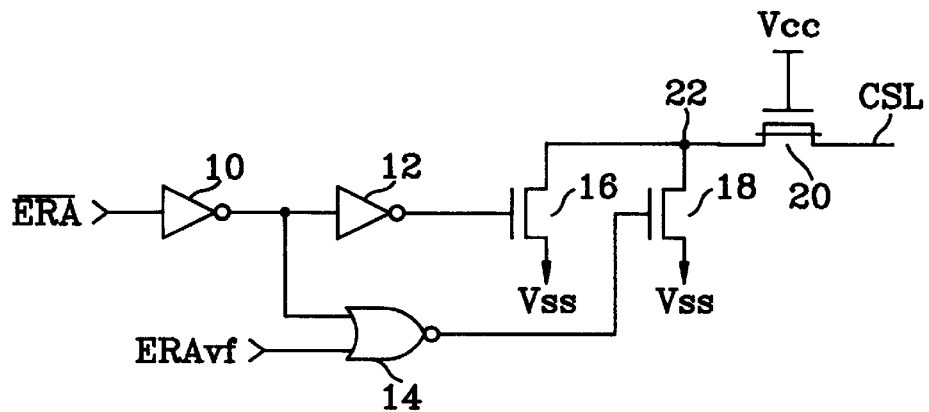
FIG. 2 is a schematic circuit diagram illustrating a common source line driving circuit according to an embodiment of the present invention.

FIG. 2 is a schematic circuit diagram illustrating a common source line driving circuit according to an embodiment of the present invention. The common source line driving circuit is connected in common to sources of second selection transistors of a plurality of cell units in the memory cell array. Therefore, a high density EEPROM, such as, for example, 32 mega-bit EEPROM, may include at least two on-chip common source line driving circuits, each being formed in close proximity of the memory cell array on the semiconductor substrate or chip in consideration of the resistance of each common source line.

As shown in FIG. 2, the common source line driving circuit comprises an inverter 10 whose input is connected to an erase signal $\overline{ERA}$, and a NOR gate 14 whose two input terminals are respectively connected to an erase verifying signal $ERA_{vf}$ and the output of the inverter 10. The gates of N-channel transistors 16 and 18, which are resistance means according to a feature of the present invention, are respectively connected to the output of an inverter 12 inverting the output of the inverter 10 and the output of the NOR gate 14. The sources of the N-channel transistors 16 and 18 are connected to a reference potential such as a ground potential Vss. The drains of the transistors 16 and 18 are connected in common to a node 22. Between the node 22 and the common source line CSL is connected the channel of a depletion mode N-channel transistor (hereinafter also referred to as D-type transistor) 20 whose gate is connected to the power supply voltage Vcc.

Hereinbelow, the operation of the common source line driving circuit of FIG. 2 will be described. The organization of the memory cell array, construction of the sense amplifier SA and its operation, such as for memory cell erase and read, are disclosed in U.S. patent application Ser. No. 08/441,177, now U.S. Pat. No. 5,546,341.

The erase signal $\overline{ERA}$ remains in a "L" state during an erase operation and in a "H" state during the remaining operations except for the erase operation. The erase verifying signal $ERA_{vf}$ stays in a "H" state during an erase verifying operation and in a "L" state during the remaining operations. Therefore, during the erase verifying operation, both signals $\overline{ERA}$ and $ERA_{vf}$ are in "H" states. Accordingly, the transistor 16 is turned on and the transistor 18 is turned off.

As previously discussed in connection with FIG. 1C, during the erase verifying operation, a reference potential, i.e. ground potential, is applied to the control gates of memory cells MC, and a power supply voltage is applied to the gates of first and second selection transistors ST1 and ST2. The current (or verifying current) from the sense amplifier SA having a current source circuit is also supplied to the bit line. Therefore, the verifying current flows via transistors ST1, MC, ST2, 20 and 16 which are all turned on. According to a feature of the present invention, the turn-on resistance of the N-channel transistor 16 has a predetermined value which is determined according to a desired threshold voltage margin for the erased memory cells. The voltage drop across the turn-on resistance of the transistor 16 by the verifying current renders the potential on the common source line CSL positive, thereby ensuring the threshold voltage margin for the memory cells MC. Thus, the present invention has an advantage of clearly ensuring the threshold voltage margin by using the turn-on resistance of the transistor 16 and the verifying current without requiring a separate voltage generator to produce a positive voltage.

During a read operation, since signals $\overline{ERA}$ and $ERA_{vf}$ are respectively in "H" and "L" states, N-channel transistors 16 and 18 are both turned on. Therefore, since the turn-on resistance of the transistors 16 and 18 provides parallel resistances between the node 22 and the ground, the sum of the parallel resistances is less than the value of each turn-on resistance. Therefore, the voltage drop during the read operation according to the sum of the parallel resistances and a read current supplied from the sense amplifier SA is less than that occurring during the erase verifying operation. The difference between these two voltage drops provides an effective threshold voltage margin for the erased memory cells. In turn, this effective threshold voltage margin allows safe data from erased memory cells to be read out during the read operation. For example, assuming that the turn-on resistances of transistors 16 and 18 are respectively 62.5 ohms and 12.5 ohms and both the read and verifying currents are approximately 4 $\mu$A, the voltage level on the common source line CSL is about 0.2 volts during the read operation and about 1 volt during the erase verifying operation. Therefore, an effective threshold voltage margin of about 0.8 volts may be ensured. The D-type transistor 20 serves to prevent the transmission of a high voltage to the common source line CSL.

Figure 3:
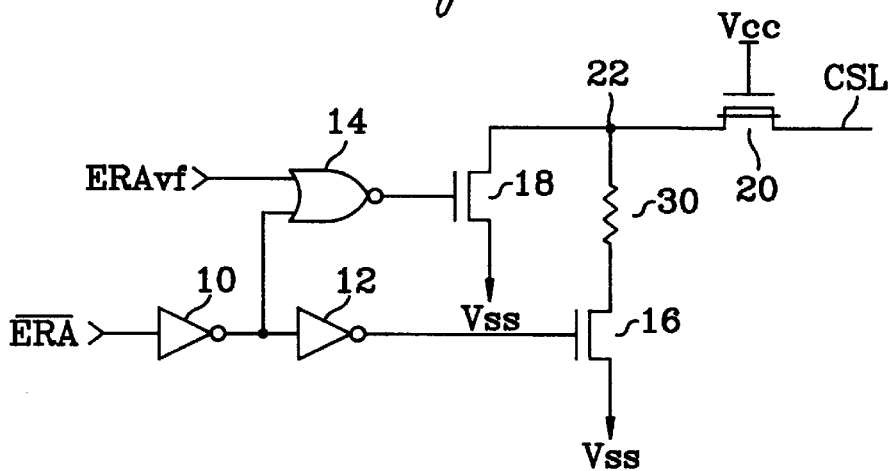
FIG. 3 is a circuit diagram illustrating another embodiment of the common source line driving circuit.

FIG. 3 is a circuit diagram illustrating another embodiment of the common source line driving circuit.

The common source line driving circuit of FIG. 3 is the same as that of FIG. 2 except for a resistor 30 inserted between the node 22 and the drain of the transistor 16. During the erase verifying operation, since signals $\overline{ERA}$ and $ERA_{vf}$ are both in "H" states, the N-channel transistor 18 is turned off and the N-channel transistor 16 is turned on. Therefore, during the erase verifying operation, the voltage level or potential on the line CSL is the voltage drop determined by the verifying current from the sense amplifier SA and the sum of the turn-on resistance of the transistor 16 and the resistance of resistor 30. On the other hand, during the read operation, the potential on the line CSL is determined by turn-on resistances of transistors 16 and 18, the resistance value of the resistor 30 and the read current from the sense amplifier SA. The effective threshold voltage margin for erased memory cells is given by the difference between both potentials on the line CSL during the erase and erase verifying operations.

Figure 4:
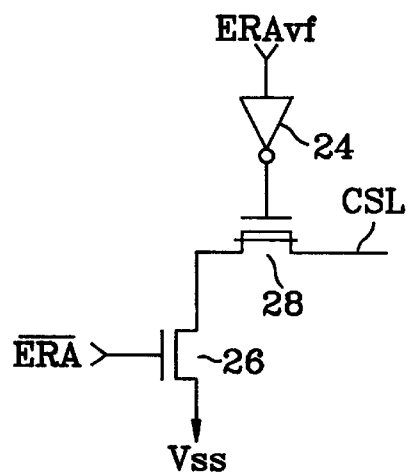
FIG. 4 is a circuit diagram illustrating still another embodiment of the common source line driving circuit.

FIG. 4 is a circuit diagram illustrating still another embodiment of the present invention. In the drawing, the channels of a D-type transistor 28 and an N-type transistor 26 are connected in series between the common source line CSL and the reference potential $V_{SS}$. The gate of D-type transistor 28 is connected to the output of an inverter 24 inverting the erase verifying signal $ERA_{vf}$. The gate of N-channel transistor 26 is connected to the erase signal $\overline{ERA}$. The gate of D-type transistor 28 is supplied with the ground potential during the erase verifying operation and the power supply voltage Vcc, which is higher than the ground potential, during the erase operation. Therefore, the turn-on resistance of the D-type transistor 28 during the read operation is less than that of the transistor 28 during the erase verifying operation. Since the N-channel transistor 26 is turned on during both the erase verifying and read operations, the turn-on resistance of the D-type transistor 28 is determined by the voltage level applied to the gate of the transistor 28, thereby allowing the effective threshold voltage margin for the erased memory cells to be ensured.

As discussed above, since the potential on the common source line is determined by the turn-on resistance of one or more transistor of the common source line driving circuit and the current flowing from the current source circuit during each of the erase verifying operations, the common source line driving circuit of the present invention has an advantage of easily and reliably providing the threshold voltage margin for the erased memory cells without requiring a separate voltage generator. In addition, since different voltages on the common source line during the erase verifying and read operations appear, a safe read operation for erased memory cells may be performed.

While the present invention has been described above with reference to the preferred embodiment, those in the art will appreciate that various substitutions and modifications can be made thereto without departing from the spirit and scope of the present invention, as set forth in the appended claims.

What is claimed is:

1. A nonvolatile semiconductor memory comprising:

a bit line;

a common source line;

a plurality of floating gate memory cells each having a series-connected drain-source path between said bit line and said common source line;

a current source circuit that supplies a predetermined current to said bit line which flows through said drain-source paths of said memory cells between said bit line and said common source line; and a common source line driving circuit connected to said common source line, said common source line driving circuit including a resistance which is operably connected to said common source line during an erase verifying operation of said nonvolatile semiconductor memory, said resistance causing an erase verifying voltage to develop on said common source line which allows verification that a threshold voltage of each of said memory cells exceeds a predetermined value, said common source line driving circuit further including a second resistance which is operably connected to said common source line during a read operation of said nonvolatile semiconductor memory, said second resistance causing a read voltage having a level less than said erase verifying voltage to develop on said bit line.

2. A nonvolatile semiconductor memory according to claim 1, wherein said common source line driving circuit includes a resistance selection circuit for connecting said resistance to said common source line during said erase verifying operation and for connecting said second resistance to said common source line during said read operation.

* * * * *